(12) United States Patent
Fornara et al.

(10) Patent No.: US 8,729,668 B2
(45) Date of Patent: May 20, 2014

(54) ADJUSTABLE RESISTOR

(75) Inventors: Pascal Fornara, Pourrieres (FR); Arnaud Regnier, Les Taillades (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 0 days.

(21) Appl. No.: 13/552,973

(22) Filed: Jul. 19, 2012

(65) Prior Publication Data
US 2013/0032926 A1 Feb. 7, 2013

(30) Foreign Application Priority Data

Aug. 1, 2011 (FR) ..................... 11 57056

(51) Int. Cl.
*H01L 21/02* (2006.01)

(52) U.S. Cl.
USPC .......................................... 257/538

(58) Field of Classification Search
CPC . H01L 28/20; H01L 27/0802; H01L 27/0688; H01L 27/0629; H01L 27/11526; H01L 27/11521
USPC .................... 257/536, 538, E27.047
See application file for complete search history.

(56) References Cited

U.S. PATENT DOCUMENTS

| 5,952,695 | A * | 9/1999 | Ellis-Monaghan et al. .. 257/347 |
| 6,369,409 | B1 * | 4/2002 | Takasu et al. ................. 257/60 |
| 6,376,319 | B2 * | 4/2002 | Ang et al. ..................... 438/300 |
| 2002/0025691 | A1 * | 2/2002 | Ohmi et al. .................... 438/787 |
| 2004/0175924 | A1 | 9/2004 | Choi |
| 2005/0116301 | A1 | 6/2005 | Shaw |
| 2009/0002120 | A1 | 1/2009 | Molin |
| 2011/0108902 | A1 | 5/2011 | Fornara |

FOREIGN PATENT DOCUMENTS

EP 2264759 12/2010

* cited by examiner

*Primary Examiner* — Nikolay Yushin
(74) *Attorney, Agent, or Firm* — The Noblitt Group, PLLC

(57) ABSTRACT

An adjustable resistor formed on a first insulating layer of a substrate, including: a first polysilicon layer covered with a second insulating layer of a first thickness, except in a region where the first polysilicon layer is covered with a thin insulator layer of a second thickness smaller than the first thickness; a second polysilicon layer covering the second insulating layer and the thin insulator layer; on each side of the second insulating layer and at a distance from it, a first and a second conductive vias providing access to the terminals of the resistor on the first polysilicon layer; and a third conductive via providing access to a contacting area on the second polysilicon layer.

8 Claims, 5 Drawing Sheets

ADJUSTABLE RESISTOR

CROSS REFERENCE TO RELATED APPLICATION

This application is a translation of and claims the priority benefit of French patent application Ser. No. 11/57056 filed on Aug. 1, 2011, entitled "ADJUSTABLE RESISTOR", which is hereby incorporated by reference to the maximum extent allowable by law.

BACKGROUND OF THE INVENTION

1. Field of the Invention

The present invention relates to adjustable resistors and to the use of such resistors to hide a code in an integrated circuit.

2. Discussion of Current Technologies

In certain integrated circuit technologies, especially in technologies incorporating floating-gate memories, two polysilicon layer levels are used.

FIG. 1 is a cross-section view illustrating various elements currently formed in integrated circuits using such technologies.

A memory cell 3, of the type described in patent application WO-2009/087335 of the applicants, manufactured on a silicon substrate 1, comprises a first region 5 of a layer of a first polysilicon level and a second region 7 of a layer of a second polysilicon level. Region 5 forms the floating gate of the memory cell and region 7 forms its control gate. The floating gate is insulated from substrate 1 by a thin insulator layer 9. The floating gate and the control gate are separated by an insulating layer comprising a first region 11 and a second region 12. Region 11 of the insulating layer is for example formed of an oxide-nitride-oxide (ONO) stack, for example, a silicon nitride layer between two silicon oxide layers. Region 12 is for example formed of a silicon oxide layer having a smaller thickness than the stack of region 11. Memory cell 3 further comprises two spacers 13 and source and drain regions 15. Memory cell 3 is insulated from the other integrated circuit elements by insulating areas 16.

A low-voltage (LV) MOS transistor 17, manufactured on the same substrate 1, comprises a third region 19 of the layer of the second polysilicon level, insulated from substrate 1 by a thin insulator layer 21. Polysilicon region 19 forms the gate of MOS transistor 17. MOS transistor 17 further comprises two spacers 23 and source and drain regions 25. MOS transistor 17 is insulated from the other integrated circuit elements by insulating areas 26.

A resistor 27, formed above an insulating area 29 of substrate 1, comprises a fourth region 31 of the layer of the first polysilicon level and a fifth region 33 of the layer of the second polysilicon level. Polysilicon regions 31 and 33 are insulated from each other by an insulating layer 35. Insulating layer 35 is of same nature and has been formed at the same time as insulator region 11 of memory cell 3.

First and fourth regions 5 and 31 of the layer of the first polysilicon level are N-type doped, for example, with a dopant element concentration approximately ranging from $5.10^{18}$ to $5.10^{19}$ atoms/cm$^3$.

Elements 3, 17, and 27 are covered with an insulating overall layer 37 intended to insulate them from the first interconnect metal level. Vias 38 crossing insulator layer 37 provide access to source, drain, and gate contacting areas of MOS transistor 17 and of memory cell 3, as well as to contacting areas of resistor 27 on fourth region 31 of the layer of the first polysilicon level.

Thus, the elements of FIG. 1 use a technology of deposition and etching of a layer of a first polysilicon level, of deposition and etching of a stack of insulating layers (ONO), of forming of a thin insulator layer instead of regions of said stack, followed by the deposition and etching of a layer of a second polysilicon level. In particular, to form transistors 17, regions of the layer of the first polysilicon level and of the ONO-type stack are removed by etching and a thin insulator layer is formed above the upper surface of substrate 1 in place of said stack. Further, the steps of etching of the ONO-type stack and of forming of a thin insulator layer instead of regions of said stack, on the first polysilicon level, are also used in the specific case where memory cells 3 of the type described in patent application WO-2009/087335 of the applicants are desired to be formed.

Further, resistors of the type illustrated in FIG. 1, of different values, may be used to store a code. A first solution is to manufacture resistors of different dimensions. A second solution comprises using different dopant element concentrations in polysilicon regions 31. However, the code may easily be discovered. Indeed, a modification in the resistor dimensions can easily be detected. It is also possible to retrace the dopant element concentration in polysilicon region 31 by reverse engineering.

Thus, adjustable resistors capable of being used to hide a code in an integrated circuit are needed.

SUMMARY OF THE INVENTION

An embodiment provides an adjustable resistor.

An embodiment provides the use of such resistors to hide a code in an integrated circuit.

An embodiment provides a method for manufacturing adjustable resistors which requires no additional step in conventional integrated circuit manufacturing technologies such as described hereabove.

Thus, an embodiment provides an adjustable resistor formed on a first insulating layer of a substrate, comprising: a first polysilicon layer covered with a second insulating layer of a first thickness, except in a region where the first polysilicon layer is covered with a thin insulator layer of a second thickness smaller than the first thickness; a second polysilicon layer covering the second insulating layer and the thin insulator layer; on each side of the second insulating layer and at a distance from it, a first and a second conductive vias providing access to the terminals of the resistor on the first polysilicon layer; and a third conductive via providing access to a contacting area on the second polysilicon layer.

According to an embodiment, said second insulating layer is formed of a stack of a first silicon oxide layer, of a silicon nitride layer, and of a second silicon oxide layer.

According to an embodiment, the thin insulator layer is a silicon oxide layer having a thickness smaller than 5 nm.

An embodiment further provides a method for manufacturing an adjustable polysilicon resistor on a substrate, comprising the steps of: above a first insulating layer of a substrate, depositing a first polysilicon layer, followed by a second insulating layer of a first thickness; etching a region of the second insulating layer to reach the first polysilicon layer; in the etched region, above the first polysilicon layer, forming a thin insulator layer of a second thickness smaller than the first thickness; and depositing a second polysilicon layer above the thin insulator layer and the second insulating layer.

According to an embodiment, said second insulating layer is formed of a stack of a first silicon oxide layer, of a silicon nitride layer, and of a second silicon oxide layer.

Another embodiment provides a method for using an adjustable resistor described hereabove, comprising a step of adjusting the value of the resistance of the first polysilicon layer between its terminals by applying a voltage, via the third conductive via, to the second polysilicon layer.

Another embodiment provides a code hidden in an integrated circuit, comprising: first strips and second strips of a first polysilicon layer, parallel and spaced apart, covered with an insulating layer of a first thickness, except in a region of each second strip where the first polysilicon layer is covered with a thin insulator layer of a second thickness smaller than the first thickness; and a second polysilicon layer covering each of the strips of the first polysilicon layer coated with insulator.

According to an embodiment, the second polysilicon layer is continuous.

According to an embodiment, said insulating layer is formed of a stack of a first silicon oxide layer, of a silicon nitride layer, and of a second silicon oxide layer.

According to an embodiment, the thin insulator layer is a silicon oxide layer having a thickness smaller than 5 nm.

The foregoing and other aspects will be discussed in detail in the following non-limiting description of specific embodiments in connection with the accompanying drawings.

BRIEF DESCRIPTION OF THE DRAWINGS

For clarity, the same elements have been designated with the same reference numerals in the different drawings and, further, as usual in the representation of integrated circuits, the various drawings are not to scale.

DETAILED DESCRIPTION

The applicants provide a method for manufacturing adjustable resistors in integrated circuits incorporating elements such as those illustrated in FIG. 1, FIGS. 2A to 2C are cross-section views illustrating successive steps of a method for manufacturing an adjustable resistor.

Figure 1:
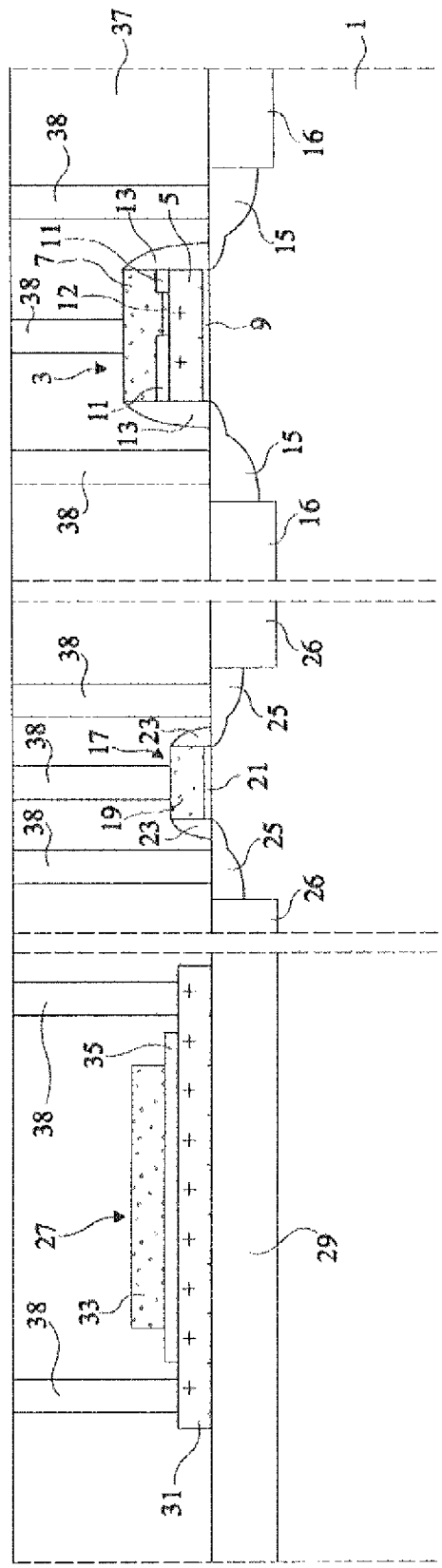
FIG. 1 is a cross-section view illustrating various elements formed in integrated circuits incorporating floating-gate memories.
Figure 2A:
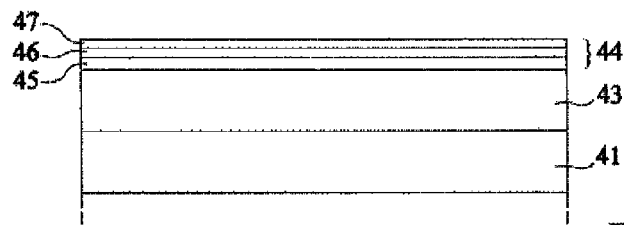
FIGS. 2A to 2C are cross-section views illustrating successive steps of a method for manufacturing an adjustable resistor above an insulating layer of a substrate.

FIG. 2A is a cross-section view schematically showing an insulating layer 41 formed on a substrate, on which a first polysilicon layer 43 has been deposited. First polysilicon layer 43 has then been covered with a stack of insulating layers 44. Insulating layer stack 44 for example is an oxide-nitride-oxide (ONO) stack 45, 46, 47 such as described in relation with FIG. 1.

Figure 2B:
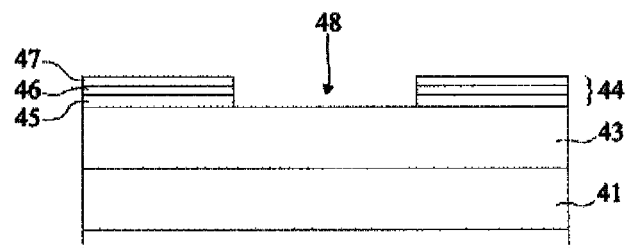

FIG. 2B illustrates of step of etching of insulating layer stack 44. During this step, an opening 48 has been formed, by etching of stack 44, to reach first polysilicon layer 43.

Figure 2C:
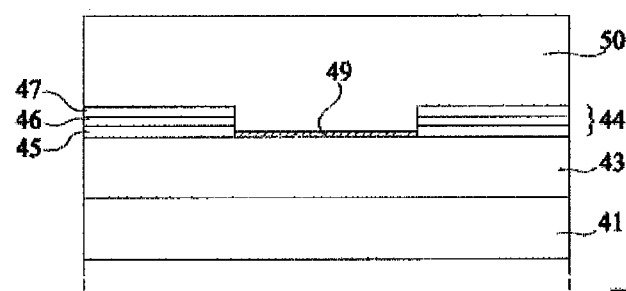

FIG. 2C illustrates a step of forming of a thin insulator layer 49, of smaller thickness than stack 44, above the upper surface of first polysilicon layer 43, in the region from which stack 44 has been removed. Thin insulator layer 49 for example is a silicon oxide layer, for example obtained by thermal growth. The step of forming of thin insulator layer 49 is followed by a step of depositing of a second polysilicon layer 50 above the stack of insulating layers 44 and above thin insulator layer 49.

An advantage of the method for manufacturing an adjustable resistor such as described hereabove is that it requires no additional step with respect to a technology enabling to manufacture the elements illustrated in FIG. 1. In particular, especially to form low-voltage transistors 17, it was already provided to etch the stack of insulating layers (ONO) and to form a thin insulator layer 21 on the upper surface of substrate 1 in place of said stack. To obtain the structure of FIG. 2C, it is thus sufficient to modify the mask currently used to remove the ONO stack in low-voltage transistor regions, by adding thereto an opening at the level of opening 48. The same mask can then be used to simultaneously perform the operations of etching of the ONO stack on the one hand, and of forming of thin insulator layers 21 and 49 on the other hand for low-voltage transistors and for adjustable resistors.

Figure 3A:
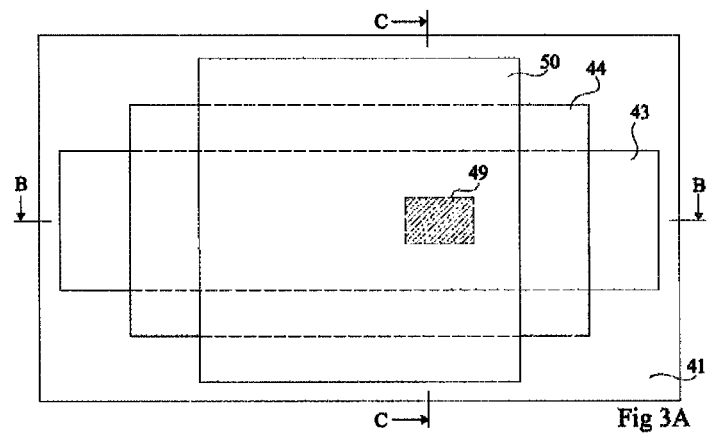
FIG. 3A is a top view of an embodiment of an adjustable resistor and FIGS. 3B and 3C are corresponding cross-section views.
Figure 3B:
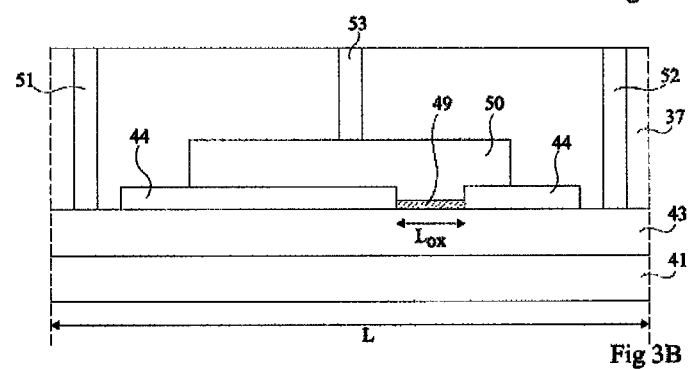
Figure 3C:
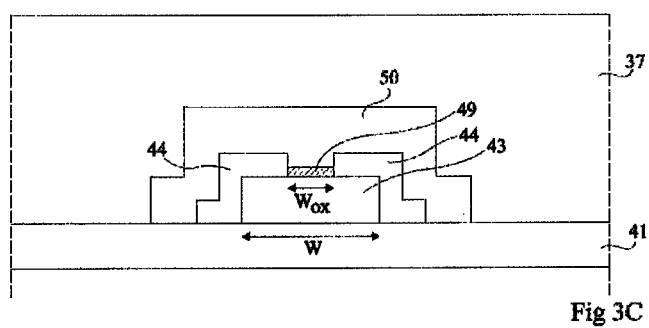

An adjustable resistor, manufactured by a method such as described in relation with FIGS. 2A to 2C, is illustrated in FIGS. 3A to 3C.

FIG. 3A is a top view of an adjustable resistor, formed on an insulating layer 41 of a substrate. A first polysilicon layer 43 is covered with a stack of insulating layers 44, except in a region where the first polysilicon layer is covered with a thin insulator layer 49, of smaller thickness than stack 44. Insulating layer stack 44 and thin insulating layer 49 are covered with a second polysilicon layer 50. First polysilicon layer 43 is heavily N-type doped, for example, with a dopant element concentration approximately ranging from $5.10^{18}$ to $5.10^{19}$ atoms/cm$^3$. The thickness of first polysilicon layer 43 for example ranges between 50 and 150 nm, and for example is on the order of 100 nm, and the thickness of second polysilicon layer 50 for example ranges between 150 and 250 nm, and for example is on the order of 200 nm. As an example, the thickness of insulating layer stack 44 ranges between 10 and 20 nm, and for example is 15 nm, and the thickness of thin insulator layer 49 is smaller than 5 nm.

FIG. 3B is a cross-section view along plane BB of FIG. 3A. Length L of first polysilicon layer 43 for example is on the order of 600 μm and length $L_{ox}$ of thin insulator layer 49 for example is on the order of 75 μm. On each side of insulating layer stack 44 and at a distance from it, two conductive vias 51 and 52, formed in insulating overall layer 37, provide access to the resistor terminals on first polysilicon layer 43. A conductive via 53 provides access to a contacting area on second polysilicon layer 50. Conductive via 53 enables to apply a voltage on second polysilicon layer 50.

FIG. 3C is a cross-section view along plane CC of FIG. 3A. Width W of first polysilicon layer 43 for example is on the order of 1 μm and width $W_{ox}$ of thin insulator layer 49 for example is on the order of 0.35 μm.

If a voltage is applied to second polysilicon layer 50, through via 53, the value of the resistance of first polysilicon layer 43 between terminals 51 and 52 is modified. An adjustable resistor has thus been created. The variation of the resistance of first polysilicon layer 43 is considered to be due to leakages through thin insulator layer 49 between the first and the second polysilicon layer. The variation range of the resistance of first polysilicon layer 43 depends on the dimension, on the nature, and on the thickness of thin insulator layer 49.

Figure 4:
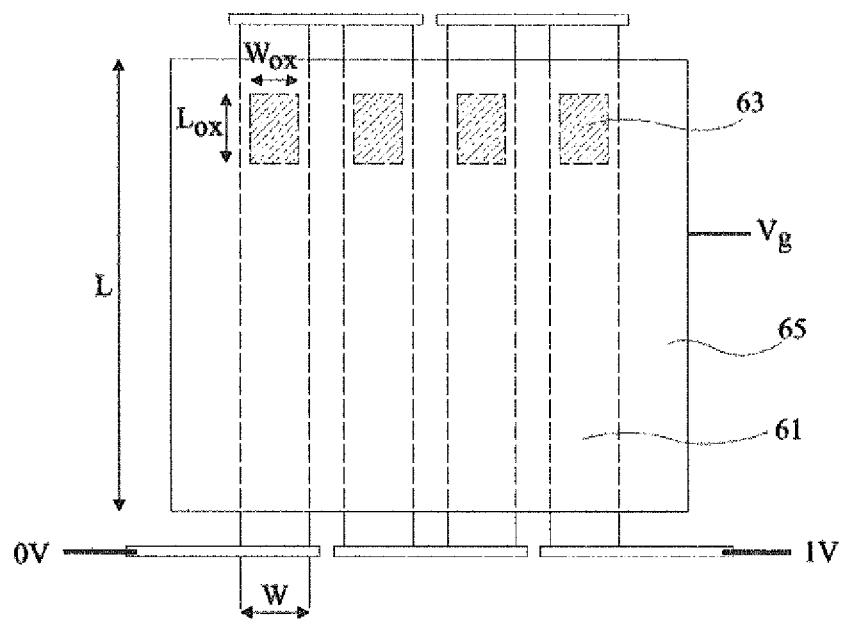
FIG. 4 is a top view of an embodiment of an adjustable resistor.

FIG. 4 is a top view of an embodiment of an adjustable resistor. Strips 61 of a first polysilicon layer, parallel and spaced apart, are covered with a stack of insulating layers, except in a region 63 of each strip where the first polysilicon layer is covered with a thin insulator layer. A second polysilicon layer 65 covers each of strips 61 coated with an insulator.

The applicants have measured the resistance per square of adjustable resistors such as illustrated in FIG. 4, by applying various voltages $V_g$ to second polysilicon layer 65. The measurements have been performed for an adjustable resistor comprising ten strips 61, only four of which are shown as an example in FIG. 4. This enables to increase the accuracy of the measurements of the resistance of the first polysilicon layer.

The following table summarizes the values of the resistance of the first polysilicon layer according to $V_g$, for a 1-V voltage applied across the resistor. Width W of strips 61 of the first polysilicon layer is 1 μm and their length L is 600 μm. The dimensions of thin insulator layer 63 are $W_{ox}$=0.36 μm and $L_{ox}$=75 μm.

|  | $V_g$ (V) | | | |
| --- | --- | --- | --- | --- |
|  | 0 | 1 | 3 | 4 |
| Resistance (ohm/square) | 712 | 706 | 563 | 312 |

According to the above table, the value of the resistance of the first polysilicon layer significantly varies according to the voltage applied to the second polysilicon layer.

The applicants provide using adjustable resistors of the type illustrated in FIGS. 3A to 3C to hide a code in an integrated circuit. The hiding principle comprises manufacturing an assembly of series resistors, only some of which are adjustable, others having a fixed value.

Figure 5:
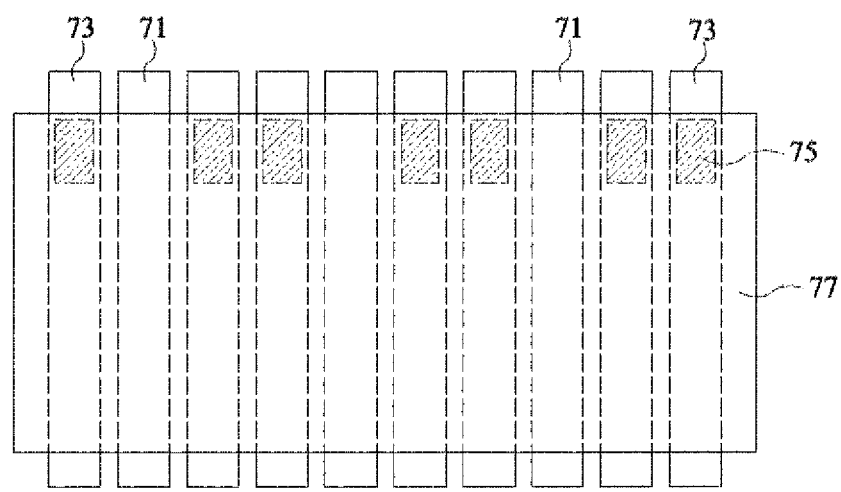
FIG. 5 is a top view of an integrated circuit portion where a code has been hidden.

FIG. 5 is a top view of an integrated circuit portion where a code has been hidden in an assembly of resistors comprising adjustable resistors of the type illustrated in FIGS. 3A to 3C.

First strips 71 and second strips 73 of a first polysilicon layer, parallel and spaced apart, formed above an insulating layer of a substrate, are covered with a stack of insulating layers, for example, an ONO stack. First strips 71 are totally coated with the stack of insulating layers. Second strips 73 comprise, like in FIGS. 3A to 3C, a window covered with a thin insulator layer 75, for example, silicon oxide. A second polysilicon layer 77 covers each of strips 71 and 73. This second polysilicon layer may be continuous. If a voltage is applied to second polysilicon layer 77, only the value of resistors 73 varies.

An advantage of a code of the type described hereabove is that it is difficult to discover. Such a code may for example be dissimulated in the analog portion of an integrated circuit, where there is a plurality of conventional resistors resembling the adjustable resistors used to store the code. It is then difficult to find where thin insulator layers 75 are arranged under second polysilicon layer 77. If it is desired to remove second polysilicon layer 77 by conventional etch solutions, the stack of insulating layers (ONO) and the first polysilicon layer are also removed. It then cannot be seen that the stack of insulating layers is modified at certain locations.

Figure 6:
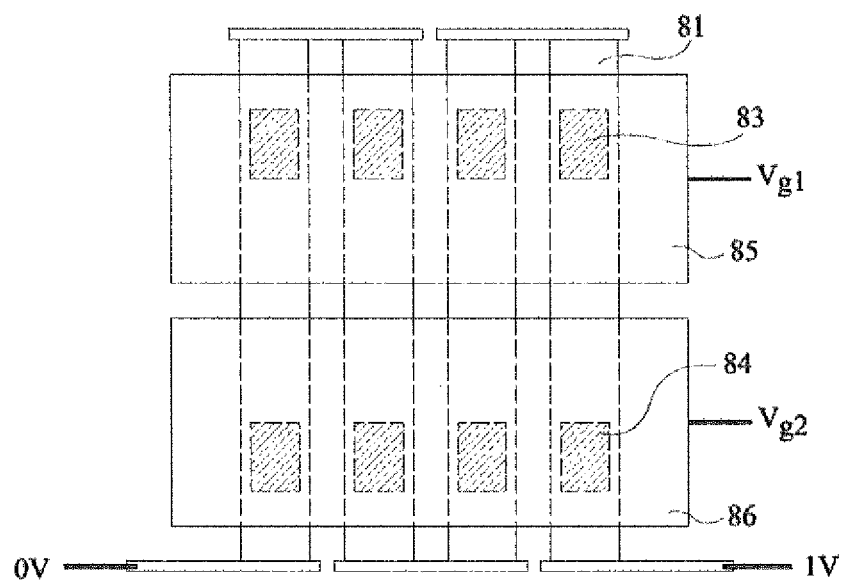
FIG. 6 is a top view of another embodiment of an adjustable resistor.

FIG. 6 is a top view of another embodiment of an adjustable resistor. Strips 81 of a first polysilicon layer, parallel and spaced apart, are covered with a stack of insulating layers, except in first regions 83 and second regions 84 of each strip, where the first polysilicon layer is covered with a thin insulator layer. A polysilicon layer 85 covers a portion of each of strips 81 comprising first insulator regions 83. A polysilicon layer 86 covers a portion of each of strips 81 comprising second insulator regions 84. Two adjustable resistor levels are thus obtained. The value of the resistances can then be modified by applying a voltage $V_{g1}$ to polysilicon layer 85, and a voltage $V_{g2}$ to polysilicon layer 86. A code can be hidden in such a resistor assembly, similarly to the example illustrated in FIG. 5, by forming insulator regions 83 and/or 84 in some of strips 81 only.

An additional advantage of adjustable resistors of the type described in relation with FIGS. 3A to 3C is the fact that the variation of the value of the resistance of first polysilicon layer 43 according to the voltage applied to second polysilicon layer 50 is kept in a wide temperature range, for example, from −40° C. to 125° C.

In the foregoing, the adjustable and non-adjustable resistors have been described as being arranged side by side. They may be arranged at various locations of the integrated circuit.

Specific embodiments of the present invention have been described. Various alterations and modifications will occur to those skilled in the art. In particular, in all the foregoing, the stack of insulating layers may be formed of a single insulating layer. It should be noted that those skilled in the art may combine various elements of these various embodiments and variations without showing any inventive step.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. An adjustable resistor formed on a first insulating layer of a substrate, comprising:
    a first polysilicon layer covered with a second insulating layer of a first thickness, except in a region where the first polysilicon layer is covered with a thin insulator layer of a second thickness smaller than the first thickness;
    a second polysilicon layer covering the second insulating layer and the thin insulator layer;
    on each side of the second insulating layer and at a distance from it, a first and a second conductive via providing access to the terminals of the resistor on the first polysilicon layer; and
    a third conductive via providing access to a contacting area on the second polysilicon layer.

2. The adjustable resistor of claim 1, wherein said second insulating layer is formed of a stack of a first silicon oxide layer, of a silicon nitride layer, and of a second silicon oxide layer.

3. The adjustable resistor of claim 1, wherein the thin insulator layer is a silicon oxide layer having a thickness smaller than 5 nm.

4. A method for using the adjustable resistor of claim 1, comprising a step of adjusting the value of the resistance of the first polysilicon layer between its terminals by applying a voltage, via the third conductive via, to the second polysilicon layer.

5. A code hidden in an integrated circuit, comprising:
    first strips and second strips of a first polysilicon layer, parallel and spaced apart, covered with an insulating layer of a first thickness, except in a region of each second strip where the first polysilicon layer is covered with a thin insulator layer of a second thickness smaller than the first thickness; and a second polysilicon layer covering each of the strips of the first polysilicon layer coated with insulator.

6. The code of claim 5, wherein the second polysilicon layer is continuous.

7. The code of claim 5, wherein said insulating layer is formed of a stack of a first silicon oxide layer, of a silicon nitride layer, and of a second silicon oxide layer.

8. The code of claim 5, wherein the thin insulator layer is a silicon oxide layer having a thickness smaller than 5 nm.

* * * * *